US00RE45320E

(19) United States
(12) Reissued Patent
Jaffe et al.

(10) Patent Number: US RE45,320 E
(45) Date of Reissued Patent: Jan. 6, 2015

(54) VIDEO DOCK FOR PORTABLE MEDIA PLAYER

(75) Inventors: Jennifer Jaffe, Portland, OR (US); Scott Ballantyne, New York, NY (US); Steve Stark, Portland, OR (US); Joe O'Sullivan, Loughborough (GB); Phillip H. Salvatori, Salem, OR (US); Donald Rhodes, Lake Oswego, OR (US)

(73) Assignee: Seiko Epson Corporation, Tokyo (JP)

(21) Appl. No.: 13/253,894

(22) Filed: Oct. 5, 2011
(Under 37 CFR 1.47)

Related U.S. Patent Documents

Reissue of:
(64) Patent No.: 7,599,177
Issued: Oct. 6, 2009
Appl. No.: 11/609,868
Filed: Dec. 12, 2006

U.S. Applications:
(60) Provisional application No. 60/749,978, filed on Dec. 12, 2005.

(51) Int. Cl.
*G06F 1/16* (2006.01)

(52) U.S. Cl.
USPC ..... 361/679.41; 361/679.4; 439/131; 363/98; 381/79

(58) Field of Classification Search
USPC ..... 725/105, 81; 359/649, 716; 361/679.41, 361/679.45, 679.56; 345/2.2, 30, 168, 501, 345/905, 173, 7, 667; 353/13, 70, 15, 30, 353/122, 79, 119, 94, 42; 710/303; 381/79, 381/334; 439/131; 348/14.04, 744; 386/230; 363/98
See application file for complete search history.

(56) References Cited

U.S. PATENT DOCUMENTS

| | | | | |
|---|---|---|---|---|
| 5,081,534 | A | | 1/1992 | Geiger et al. |
| 5,204,768 | A | | 4/1993 | Tsakiris et al. |
| 5,664,859 | A | | 9/1997 | Salerno et al. |
| 5,847,748 | A | * | 12/1998 | Laughlin ..... 725/105 |
| 5,993,012 | A | | 11/1999 | Buchanan et al. |
| 6,195,068 | B1 | | 2/2001 | Suzuki et al. |
| 6,443,574 | B1 | | 9/2002 | Howell et al. |
| 6,489,932 | B1 | | 12/2002 | Chitturi et al. |

(Continued)

FOREIGN PATENT DOCUMENTS

| | | | |
|---|---|---|---|
| JP | 2005-158231 | A | 6/2005 |
| JP | 2006-011346 | A | 1/2006 |
| WO | WO 99/21056 | A1 | 4/1999 |
| WO | WO 03/025669 | A1 | 3/2003 |

OTHER PUBLICATIONS

International Search Report and Written Opinion mailed on Mar. 20, 2008, in PCT/US06/47463, International Filing Date of Dec. 12, 2006, for Infocus Corporation.

*Primary Examiner* — Hung Duong
(74) *Attorney, Agent, or Firm* — Oliff PLC

(57) ABSTRACT

A docking station for a portable media player. The docking station includes a docking connector to physically secure the portable media player and a communication interface to communicatively couple the portable media player to the docking station when the docking connector is physically securing the portable media player. A projection module operably linked to the communication interface and configured to receive video information from the portable media player via the communication interface projects a video image derived from the video information away from the docking station onto a viewing surface.

127 Claims, 4 Drawing Sheets

(56) References Cited

U.S. PATENT DOCUMENTS

| | | | | |
|---|---|---|---|---|
| 6,626,543 | B2 | 9/2003 | Derryberry | |
| 6,697,032 | B2 | 2/2004 | Chitturi et al. | |
| D495,336 | S | 8/2004 | Andre et al. | |
| 6,772,265 | B2 | 8/2004 | Baweja et al. | |
| 6,966,651 | B2 | 11/2005 | Johnson | |
| 7,044,605 | B2 | 5/2006 | Olson et al. | |
| 7,052,136 | B2 | 5/2006 | Johnson | |
| 7,095,867 | B2 | 8/2006 | Schul et al. | |
| 7,144,120 | B2 | 12/2006 | Soper et al. | |
| 7,342,723 | B2 * | 3/2008 | Rodriguez et al. | 359/649 |
| 7,384,158 | B2 * | 6/2008 | Ramachandran et al. | 353/70 |
| 2001/0001083 | A1 * | 5/2001 | Helot | 439/131 |
| 2002/0063855 | A1 | 5/2002 | Williams | |
| 2003/0117587 | A1 | 6/2003 | Olson et al. | |
| 2003/0133081 | A1 | 7/2003 | Miyashita | |
| 2004/0228622 | A1 | 11/2004 | Schedivy | |
| 2004/0233394 | A1 | 11/2004 | Gohman | |
| 2004/0239753 | A1 | 12/2004 | Proctor et al. | |
| 2004/0246450 | A1 | 12/2004 | Soper et al. | |
| 2005/0053365 | A1 | 3/2005 | Adams et al. | |
| 2005/0088620 | A1 | 4/2005 | Dwyer et al. | |
| 2005/0122484 | A1 | 6/2005 | Rodriguez, Jr. et al. | |
| 2005/0168937 | A1 * | 8/2005 | Yin et al. | 361/686 |
| 2006/0250764 | A1 * | 11/2006 | Howarth et al. | 361/683 |
| 2006/0285090 | A1 | 12/2006 | Rodriguez | |
| 2007/0130592 | A1 * | 6/2007 | Haeusel | 725/81 |
| 2007/0254695 | A1 * | 11/2007 | Langberg et al. | 455/556.1 |
| 2008/0075295 | A1 * | 3/2008 | Mayman et al. | 381/79 |

* cited by examiner

Fig. 2
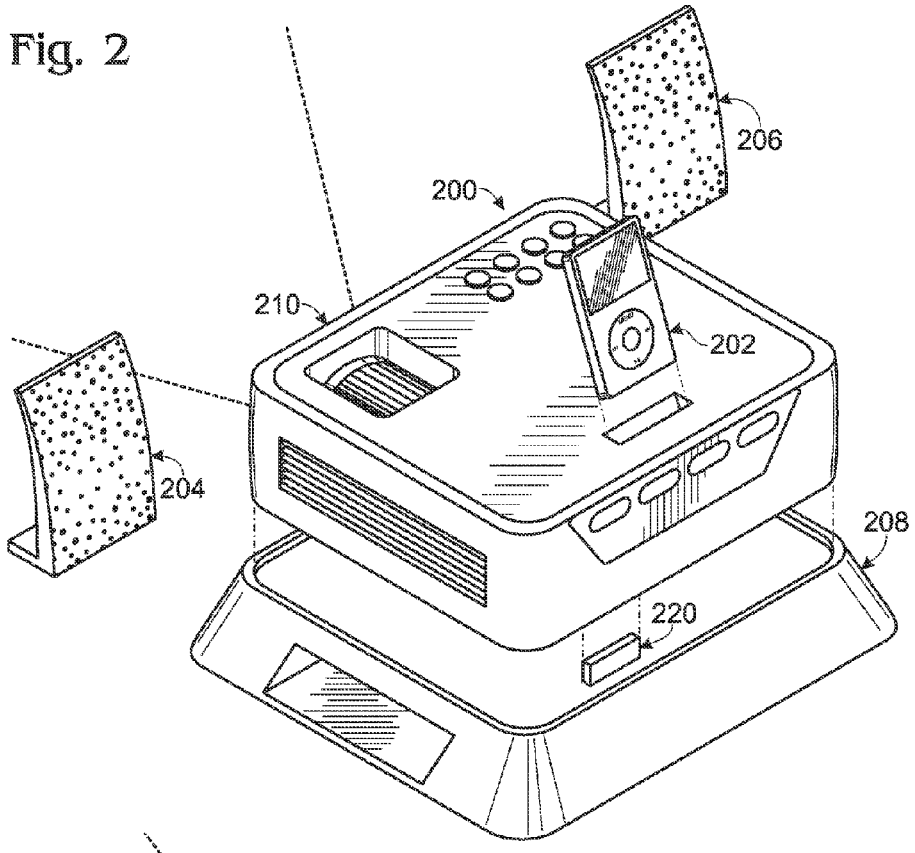
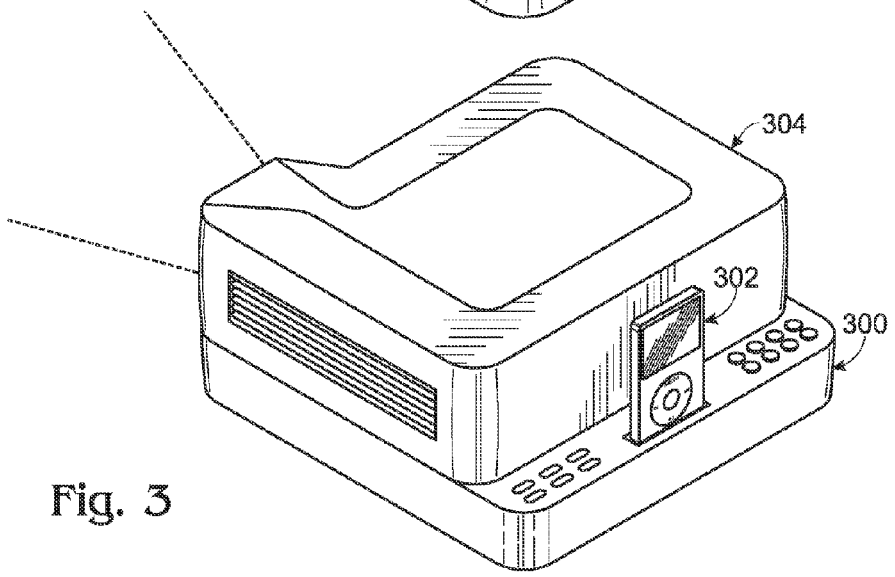
Fig. 3

VIDEO DOCK FOR PORTABLE MEDIA PLAYER

Matter enclosed in heavy brackets [ ] appears in the original patent but forms no part of this reissue specification; matter printed in italics indicates the additions made by reissue.

CROSS REFERENCE TO RELATED APPLICATIONS

This application *is a reissue application of U.S. Pat. No. 7,599,177, which* claims the benefit of U.S. Provisional Application No. 60/749,978, filed Dec. 12, 2005, the entirety of which [is] *are* hereby incorporated herein by reference for all purposes.

BACKGROUND AND SUMMARY

Portable media players are becoming increasingly popular. In particular, portable digital media players that are configured to hold large amounts of digitally encoded audio are becoming ubiquitous in modern culture. For example, recent studies have shown that over 22 million adults own Apple ipod® digital audio players alone.

Some portable media players are now being designed for video playback in addition to audio playback. For example, some versions of the Apple ipod® can now play digitally encoded video as well as digitally encoded audio. Many other mobile computing devices also are designed for audio/video playback, and the prevalence of such devices is expected to greatly increase in the coming years. For example, full motion video is expected to become a common feature on mobile phones and mobile computing devices.

The inventors herein have recognized that the relatively small screen size of a portable media player (or similar devices) can limit enjoyment of the media player when it is used for video playback. Furthermore, the inventors herein have recognized that at least some of the issues associated with relatively small screen size can be addressed by projecting video images from a portable media player to a relatively large display surface.

This disclosure includes several different solutions for projecting video images from a portable media player to a relatively large display surface. According to an aspect of this disclosure, a dock for a portable media player can include a projection module for projecting video images to a relatively large display surface. According to another aspect of this disclosure, a dock can be configured to operably link a projection module to a portable media player, thus allowing the portable media player to deliver video data to the projection module via the dock. According to another aspect of this disclosure, a projection module can be configured to wirelessly receive video data from a portable media player. According to another aspect of this disclosure, a portable media player can include an integrated projection module for projecting video images to a relatively large display surface.

In some embodiments, one or more speaker modules can cooperate with a projection module to provide a complete audio/video experience. The projection module and/or speaker module(s) can be configured to additionally or alternatively receive audio/video information from a source other than a portable media player. The projection module and speaker module(s) can also be operated independently of one another, so that only video or only audio is being played at a particular time.

Virtually any type of content can be projected in accordance with the present disclosure. For example, a user interface and/or application software of a portable media player can be projected onto a display surface. In some embodiments, information corresponding to the audio content that is being played can be projected onto a display surface.

In some embodiments, a remote control can be used to control the portable media player, projection module, speaker module, and/or dock. A remote control can optionally be designed with controls that substantially mimic the controls of a corresponding digital media player. In some embodiments, the controls of the portable media player can additionally or alternatively be used to control the portable media player, projection module, speaker module, and/or dock.

BRIEF DESCRIPTION OF THE DRAWINGS

FIG. 2 shows another exemplary portable media player dock including a backside projection module and a subwoofer module.

FIG. 3 shows an exemplary portable media player dock including a docking connector for directly connecting to a stand-alone projection module.

DETAILED DESCRIPTION

Figure 1A:
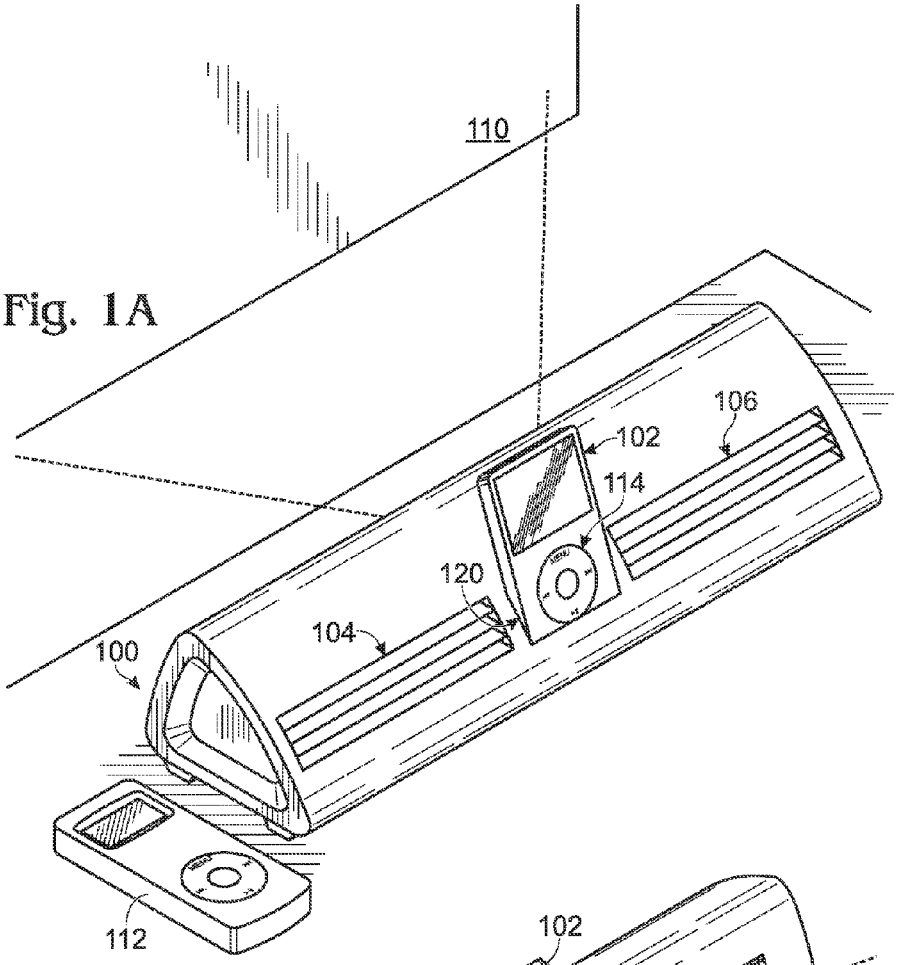
FIGS. 1A and 1B show an exemplary portable media player dock including a backside projection module.
Figure 1B:
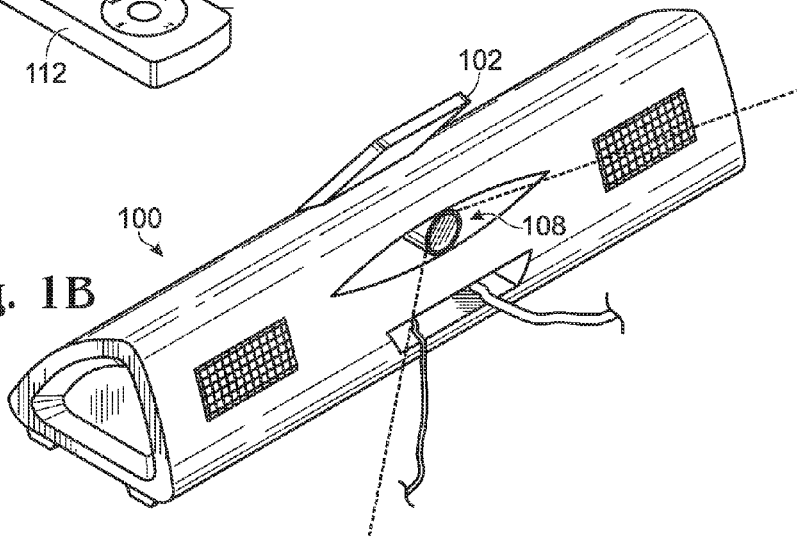

FIGS. 1A and 1B show a dock 100 that is configured to operably receive a portable media player 102. Dock 100 includes left and right speaker modules 104 and 106 for playing audio received from the portable media player. The dock also includes a projection module 108 for projecting video images onto a relatively large display surface 110. As used herein, a "relatively large display" is used to describe any display surface that is larger than the screen of the portable media player. Projected video images as small as a few inches or as large as 80 diagonal inches or more are within the scope of this disclosure. Furthermore, video resolution can range from the native resolution of the portable media player's screen to high definition video or better.

A remote control 112 can be used to control operation of the dock and/or portable media player. In some embodiments, controls 114 of the portable media player can additionally or alternatively be used to control the portable media player, projection module, speaker module, and/or dock. For example, the volume control on the portable media player can control the amplified volume of a speaker module and/or the line level audio input delivered to the speaker module. The remote control can transmit an optical signal (e.g., infrared) or a radio signal. In some embodiments, the remote control can utilize Bluetooth or another suitable communication protocol.

The dock can optionally include a relay mechanism which can relay commands received from the remote and/or translate commands received by the remote and transmit the translated commands in a format suitable for use by one or more downstream devices. For example, the dock could be configured to receive a Bluetooth signal from the remote and to translate the signal into an infrared signal that could then be transmitted to a home stereo receiver that is not capable of receiving Bluetooth commands. As another example, the dock could be configured to receive an optical or radio signal from the remote, to translate the signal into the language of the portable media player, and then to deliver the translated signal to the portable media player so that the remote can be used to control the portable media player via the dock.

Dock 100 is configured to project video images received from the portable media player. For example, the dock can be configured to project still and/or motion video images that are stored in the portable media player as digital files and/or video streams that are received by the portable media player and/or dock. Encoded and/or compressed digital files can be decompressed/decoded by the portable media player or the dock.

In some embodiments, information corresponding to the audio content that is being played can be projected onto a display surface. For example, a song name, album name, playing time, album cover art, music video, or the like can be projected. The projected information can be acquired from the portable media player, or, in some embodiments, from an external source such as a computer network (e.g., the Internet). As such, docks according to the present disclosure can optionally include one or more wired or wireless network interfaces.

In some embodiments, projected images can be dynamically altered according to the sonic attributes of the audio that is being played, so that the projected images provide a visual representation of the audio. In some embodiments, the projected images can be designed to create a desired atmosphere, such as by shining points of light to simulate a disco scene. In some embodiments, the projection module may include accessories for diffusing the projected light, and the dock may be configured to strobe one or more colors of light responsive to the music being played on the portable media player. In this way, the projection module can be used to create an atmosphere that changes with the music that is being played.

The dock may also be configured to project a user interface and/or application software images, thus allowing a user to look at a display surface while controlling the portable media player and/or the dock. This can be particularly useful when used in combination with a remote control, thus allowing a user to operate the portable media player and/or the dock without being near the portable media player and/or the dock. In some embodiments, the dock and/or portable media player may be configured to be controlled by voice activation and/or other mechanisms that allow for remote operation. In some embodiments, the dock and/or the portable media player can include one or more wired or wireless input devices, such as a keyboard or track pad, thus allowing for robust control.

Dock 100 is designed for backside projecting, in which a video image is projected out the backside of the dock. As used herein, "backside" is used to refer to the side opposite the control face of the portable media player when the portable media player is docked. Projection can additionally or alternatively be from the front, sides, top, or bottom of a dock. In some embodiments, a dock connector can be configured so that the orientation of the portable media device relative the dock can be selected from two or more different possibilities.

A projection module can be designed for short throw projection. For example, FIG. 1 shows dock 100 projecting to display surface 110, which is relatively close to the dock. Embodiments that are designed for short throw projection can use a variety of different projection configurations, including, but not limited to, those described in U.S. patent application Ser. No. 10/825,837 and U.S. Pat. No. 7,090,354, the entirety of which are hereby incorporated by reference.

In some embodiments, the projector can be configured to project an image that has a diagonal dimension that is greater than the projection distance (e.g., a 42" image projected from a projection module that is only 21" from the projection surface—a 2:1 gain ratio). Projection modules can alternatively be configured for long-throw projection without departing from the scope of this disclosure. Various different projection optics can be used, and gain ratios ranging from 0.5:1 to 10:1 or more are within the scope of this disclosure.

Short throw projection allows a dock (or other projection module) to be placed close to a screen, wall, or other display surface. Such an arrangement increases placement options and may leave more space available for viewers to position themselves without obstructing the projection. Because the projection module can be placed so close to a screen, viewers are not likely to position themselves between the projection module and the screen. Furthermore, such an arrangement allows the projector to be placed relatively low, thus allowing a portable media player to be easily docked. To facilitate tabletop placement, the projection module can be configured to project at least partially upward toward a display surface so that the projected image is substantially above the level of the dock. The projection module may include keystone correction so that the projected image is substantially rectangular, even when projected at wide and/or steep angles.

A dock can include one or more wired, wireless, or direct (docking) interfaces for receiving and/or sending audio, video and/or other types of information. For example, dock 100 includes a direct interface 120 for directly receiving portable media device 102. As used herein, a "direct" interface is used to describe an interface that couples a portable media device to the dock such that the dock mechanically supports the portable media player and forms a communication path with the portable media player. Such a connection is not required in all embodiments. A wired or wireless connection can be used. As nonlimiting examples, a wired connection can include a wired USB, USB 2.0, or IEEE1394 connection; and a wireless connection can include an IEEE 802.11a, IEEE 802.11b, IEEE802.11g, or Bluetooth connection. As other technologies are developed for transferring digital information, such technologies can be adapted for use with the presently described dock. Furthermore, such interfaces can be used as part of a direct interface that also at least partially supports the portable media player. Furthermore, an interface that is used to dock a portable media player to a dock can be used to power/recharge the portable media player in some embodiments.

It should be understood that a dock can be configured to additionally or alternatively receive audio and/or video information from a variety of sources other than a portable media player. In some embodiments, information received from other sources, such as a networked personal computer or an online media store, can be downloaded from the dock to the personal media player or vice versa. In some embodiments, the personal media player can be synced with one or more networked devices in this manner (e.g., the portable media player can be synced with the dock, and/or the dock can facilitate syncing the portable media player with another device).

In some embodiments, a direct interface can be designed to receive a particular type of portable media player. As such, the direct interface may include a proprietary mechanical and/or communication interface that corresponds to the particular portable media player. In some embodiments, such an interface may include a snap-fit mechanism. In other embodiments, a direct interface can include a standardized connector that is designed to receive a plurality of different compatible portable media players. In some embodiments, a direct interface can be designed with a plurality of different adapters for receiving a plurality of differently configured portable media players. In the illustrated embodiment, direct interface 120 is configured to receive an Apple iPod®.

A dock can include an interface for sending information, such as audio/video content from a docked portable media player, to another device, such as an external display (e.g., a computer monitor, direct-view television screen, A/V receiver, and/or external projector). Such an external display connection can be used in addition to or as an alternative to the dock's projection module. If a projection module and an external display are both used, the displays can mirror the same video images, or simultaneously display different video images. Furthermore, the portable media player may include a built-in display screen, and this screen can optionally be used in conjunction with one or more of the dock's projection module and an external display. As a nonlimiting example, the projected image from the dock's projection module may show motion video images and the portable media player screen and the external display may show a user interface, or vice versa. Nonlimiting examples of external display interfaces include DVI, HDMI, VGA, RCA, Component Video, Composite Video, S-Video, and IEEE 802.11x wireless interfaces. As other display interfaces become available, such interfaces can be adapted for use with docks in accordance with the present disclosure.

FIG. 2 shows a dock 200 that is configured to operably receive a portable media player 202. As shown in FIG. 2, dock 200 can be used with external left speaker 204 and external right speaker 206. In some embodiments, external speakers can be self-amplified, and the dock can be configured to deliver a line level output to the speakers. In some embodiments, the dock can include an amplifier for delivering an amplified signal to drive the speakers. The dock can also be used with a subwoofer speaker 208 that is configured to directly interface with the dock. In some embodiments, the dock may include a low pass filter and a line level output for an external subwoofer. In some embodiments, the left and right speakers can be connected to the subwoofer speaker, in some embodiments the left and right speakers can be connected to the dock, and/or in some embodiments one or more speakers or subwoofers can be wirelessly linked to the dock and/or the portable media player.

The dock also includes a projection module 210 for projecting video images onto a relatively large display surface. As explained above with reference to dock 100, dock 200 can receive audio/video content from a portable media player, and such content can be played via the projection module and/or the speaker modules.

FIG. 2 also shows a connector 220 on subwoofer speaker 208 that mates with a complimentary connector on dock 200. As such, dock 200 has one docking interface on its top side for receiving a portable media player and another docking interface on its bottom side for receiving another device, such as subwoofer speaker 208, or a DVD player, gaming console, etc. The precise location and type of docking connector can be adapted to compliment the form factor and A/V capabilities of a particular docking station.

FIG. 3 shows an arrangement similar to the arrangement shown in FIGS. 1A, 1B, and 2, but where a dock 300 does not include an integrated projector. Dock 300 is configured to operably receive a portable media player 302. The dock is also configured to operably couple with a projection module 304, which in this case is designed to operate as a stand-alone projector. Dock 300 effectively serves as a link between the portable media player and the projection module, so that video information from the portable media player can be projected by the projection module onto a display surface. The dock can include one or more speaker modules for playing audio content and/or can include one or more audio outputs for connecting external speakers.

The embodiment illustrated in FIG. 3 is designed such that dock 300 and projection module 304 include complementary dock connectors so that the separate units can directly communicate with one another when docked together. The projection module includes a docking connector on its bottom and the dock includes a complimentary docking connector 320 on its top. In addition to docking a projector to a docking station, several other devices can additionally or alternatively be docked in a variety of different configurations, as described in U.S. Patent Application No. 60/749,921, filed Dec. 12, 2005, the entirety of which is hereby incorporated herein by reference.

Figure 4:
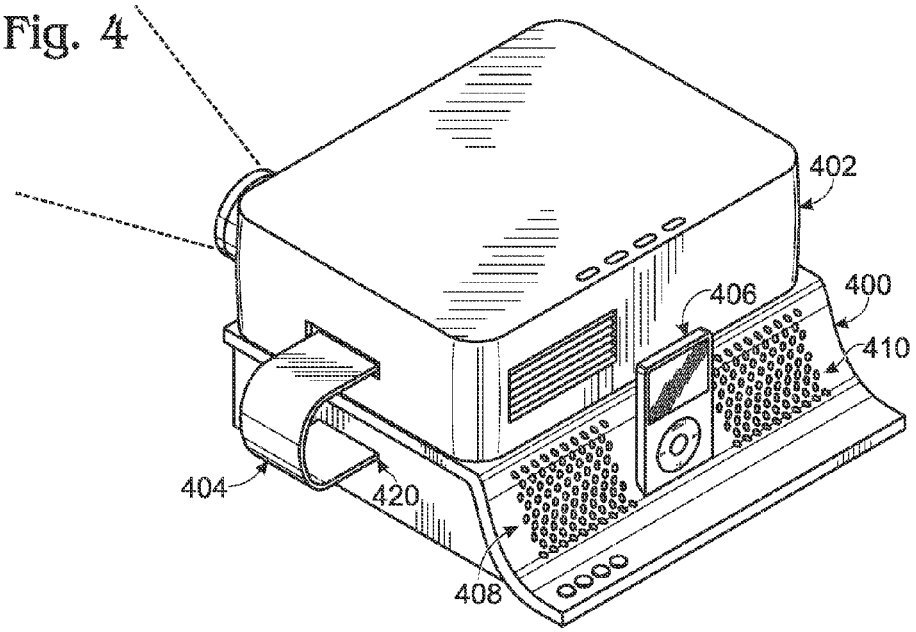
FIG. 4 shows an exemplary portable media player dock and a bridge connector for connecting the dock to a stand-alone projection module.

FIG. 4 shows a different embodiment, in which a dock 400 is configured for use with a projection module 402 that was not originally designed with a dock connector. Dock 400 includes a standard input video connector 420 on its side instead of a docking connector on its bottom. A bridge connector 404 is used to put the dock in communication with the projection module. As with the embodiment shown in FIG. 3, dock 400 is configured to operably receive a portable media player 406. Furthermore, dock 400 includes left speaker module 408 and right speaker module 410 for playing audio content.

Figure 5:
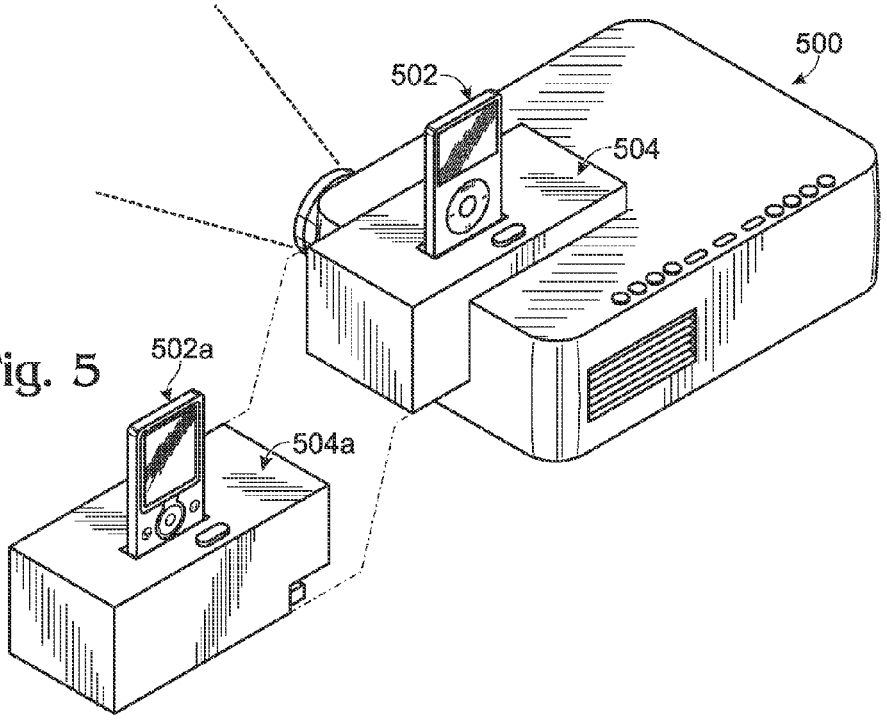
FIG. 5 shows a projection module and adapters for receiving different portable media players.

FIG. 5 shows an embodiment in which a projection module 500 is operably coupled to a portable media player 502 by way of an intermediate adapter 504. Adapter 504 can be specifically configured for compatibility with portable media player 502. Likewise, other adapters can be used to provide compatibility with different portable media players or other types of devices. For example, adapter 504a can operably couple a portable media player 502a to projection module 500, even though portable media player [504a] *502a* has a different connection interface than portable media player [504] *502*. New adapters can be manufactured as new portable media players become available, thus allowing the new portable media players to be used with an older projection module, even if the interface of the portable media player did not exist when the projection module was manufactured.

According to another aspect of this disclosure, a projection module can be integrated into a portable media player. In such embodiments, a light source with relatively low power requirements can be used, thus allowing the projector module to operate on battery power. As a nonlimiting example, a projection engine that uses laser light and/or LED light can be used. Such low power projection engines can also be used in docking applications, thus allowing battery power and increased portability.

According to another aspect of this disclosure, a display other than a projection display can be used to present video content acquired from a portable media player. In particular, a display incorporated into a head-mounted set of eyeglasses can be used to view still images, motion video, user interfaces (e.g., menus), application programs, or other visual content from a portable media player. The eyeglasses can be communicatively coupled to a portable media player by a wired or wireless connection (e.g., USB, USB 2.0, Firewire, Bluetooth, IEEE 802.11x). In some embodiments, the eyeglasses can include one or more speaker modules, such as headphones, for playing audio content, thus providing a complete portable audio/visual experience. The video and/or audio playback from the device can be operated using the controls of the portable media player. In some embodiments, the eyeglass display may include its own power supply, and in some embodiments, the eyeglass display can be powered via the portable media player.

Figure 6:
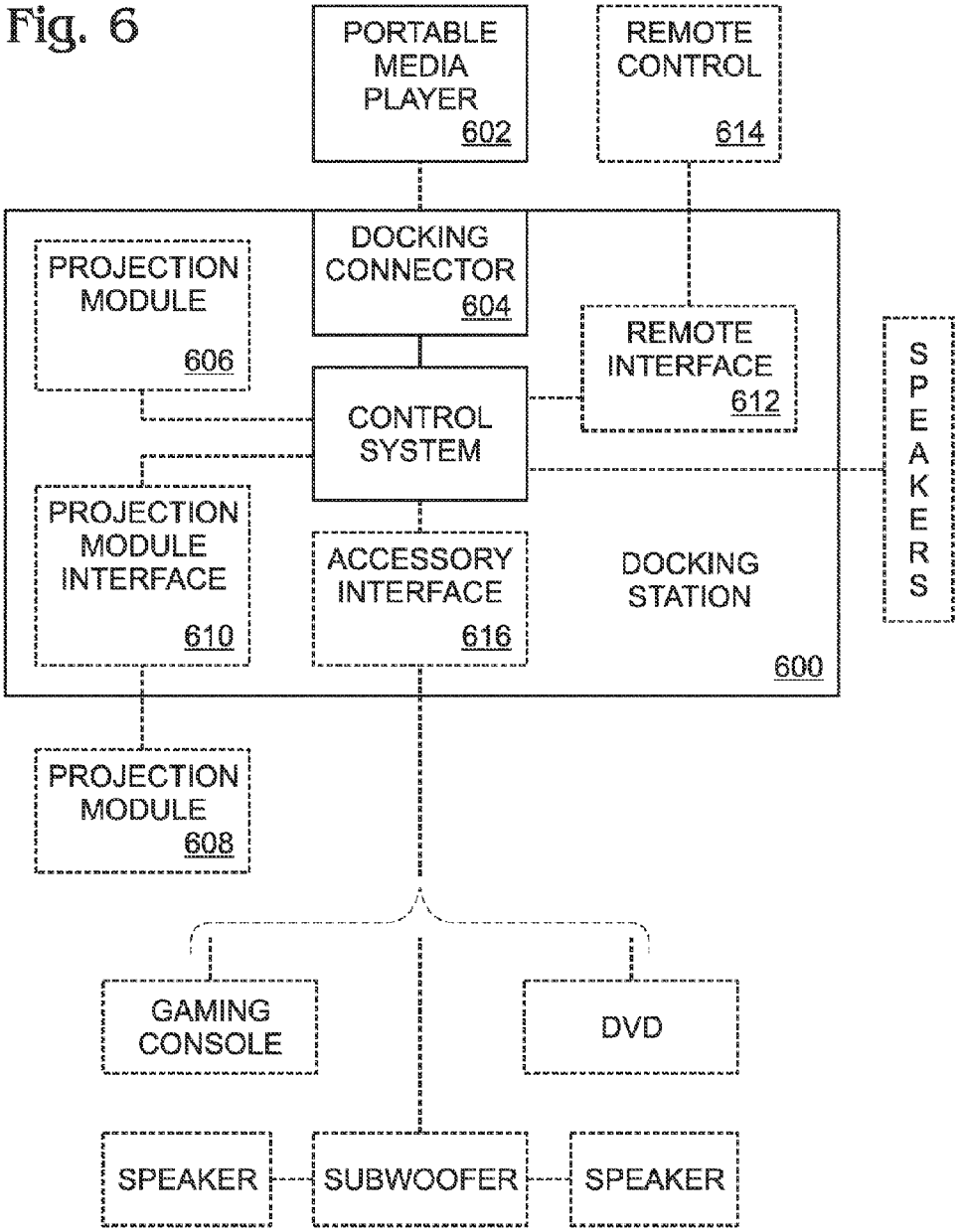
FIG. 6 schematically shows a docking station for use with a portable media player.

The present disclosure has been provided with reference to a nonlimiting subset of the various embodiments and operational principles described above and defined by the appended claims. It will be apparent to those skilled in the art that various changes in form and detail may be made without departing from the spirit and scope of the claims. Accordingly, the claims should not be interpreted as being limited to the particular embodiments disclosed herein, but rather, should be afforded the full breadth that they define. The present disclosure is intended to embrace alternatives, modifications, and variances to the particular embodiments disclosed herein. For example, disclosed features from one embodiment may be combined with disclosed features from another embodiment, or design modifications can be made to one or more disclosed features. FIG. 6 schematically shows a somewhat generalized illustration of many of the above described concepts without depicting any particular form or configuration.

FIG. 6 schematically shows a docking station 600 for a portable media player 602. Docking station 600 can include a docking connector 604 to physically secure the portable media player relative the docking station. For example, docking connector 604 can be complimentarily configured relative to a mating docking connector on the portable media player. In some embodiments, the docking connectors may snap-fit together, socket-fit together, magnetically couple, or otherwise mate.

The docking connectors can mechanically, electrically, and/or communicatively link the portable media player to the docking station. In some embodiments, docking connector 604 may include a communication interface to communicatively couple the portable media player to the dock when the docking connector is physically securing the portable media player. In other embodiments, the portable media player and the docking station may transfer information wirelessly. In some embodiments, the docking connector may include an energy interface that allows energy to be transferred from the docking station to the portable media player, for example to charge a battery. The docking connectors can be part of an adapter that matches a particular portable media player to a docking station, and several different adapters can be used so that several different media players can be used with the docking station.

Docking station 600 may include a projection module 606 operably linked to the communication interface and configured to receive video information from the portable media player via the communication interface. The projection module can project a video image away from the docking station onto a viewing surface. The video image can be derived from the video information received from the portable media player via the communication interface. In other embodiments, the projector module may be separable from the docking station and configured to dock with the docking station. For example, projection module 608 can be connected, or docked, to docking station 600 via projection module interface 610. The projection module interface optionally can be a docking interface.

In some embodiments, the projection module can be configured for short throw projection.

The docking station can include a remote interface 612 that receives commands from a remote control 614. The received commands can be relayed and/or translated by the docking station for use with one or more docked or otherwise connected devices.

The docking station can include an accessory interface 616 that can be used to dock or otherwise connect one or more accessory devices. Nonlimiting examples of accessory devices include DVD players, gaming consoles, and subwoofer speakers.

Where the disclosure or claims recite "a," "a first," or "another" element, or the equivalent thereof, that recital should be interpreted to include one or more such elements, neither requiring nor excluding two or more such elements.

The invention claimed is:

1. A docking station for a portable media player, the docking station comprising:

a docking connector to physically secure the portable media player;

a communication interface to communicatively couple the portable media player to the docking station when the docking connector is physically securing the portable media player; and a projection module operably linked to the communication interface and configured to receive video information from the portable media player via the communication interface, and to project a video image derived from the video information away from the docking station onto a viewing surface.

2. The docking station of claim 1, where the portable media player includes a front face having a display screen, and where the docking connector secures the portable media player with the display screen of the portable media player facing away from the projected video image.

3. The docking station of claim 1, where the projection module includes short throw projection optics.

4. The docking station of claim 3, where a diagonal size of the projected image is greater than a distance from the projection module to the viewing surface.

5. The docking station of claim 1, further comprising a remote command receiver to receive commands from a remote control and to deliver the commands to the portable media player via the communication interface.

6. The docking station of claim 5, where the remote command receiver translates the received commands before delivering the commands to the portable media player.

7. The docking station of claim 1, further comprising a remote control.

8. The docking station of claim 7, where the remote control includes a control interface that substantially mimics a control interface of the portable media player.

9. A docking station for a portable media player, the docking station comprising:

a docking connector to physically secure the portable media player;

a communication interface to communicatively couple the portable media player to the docking station when the docking connector is physically securing the portable media player; and a projection module interface to operably link the communication interface of the docking station to a docked projector, the projection module interface being configured to receive video information from the portable media player and to pass the video information to the docked projector so that the docked projector projects a video image derived from the video information away from the docking station onto a viewing surface.

10. The docking station of claim 9, where the portable media player includes a front face having a display screen, and where the docking connector secures the portable media player with the display screen of the portable media player facing away from the projected video image.

11. The docking station of claim 9, further comprising a remote command receiver to receive commands from a remote control and to deliver the commands to the portable media player via the communication interface.

12. The docking station of claim 11, where the remote command receiver translates the received commands before delivering the commands to the portable media player.

13. The docking station of claim 9, further comprising a remote command receiver to receive commands from a remote control and to deliver the commands to the docked projector via the projection module interface.

14. The docking station of claim 13, where the remote command receiver translates the received commands before delivering the commands to the docked projector.

15. The docking station of claim 9, where the docking station is configured to respond to commands relayed from a remote control though the docked projector.

16. The docking station of claim 9, further comprising a remote control.

17. The docking station of claim 16, where the remote control includes a control interface that substantially mimics a control interface of the portable media player.

18. A docking station for a portable media player, the docking station comprising:

an adapter including a docking connector to physically secure the portable media player and a communication interface to communicatively couple the portable media player to the docking station when the docking connector is physically securing the portable media player, wherein the adapter is one of a plurality of different adapters, each different adapter configured to secure and communicatively couple a different portable media player; and a projection module operably linked to the communication interface and configured to receive video information from the portable media player via the communication interface, and to project a video image derived from the video information away from the docking station onto a viewing surface.

19. The docking station of claim 18, where the portable media player includes a front face having a display screen, and where the docking connector secures the portable media player with the display screen of the portable media player facing away from the projected video image.

20. The docking station of claim 18, where the projection module includes short throw projection optics.

21. The docking station of claim 1, wherein the viewing surface is larger than a display screen of the portable media player.

22. The docking station of claim 1, further comprising a remote control, wherein the remote control controls the portable media player.

23. The docking station of claim 1, wherein the portable media player controls the projection module.

24. The docking station of claim 1, further comprising a speaker module, wherein the portable media player controls the speaker module.

25. The docking station of claim 1, wherein the portable media player controls the projection module and the speaker module.

26. The docking station of claim 24, wherein the portable media player controls an amplified volume of the speaker module.

27. The docking station of claim 24, wherein the portable media player controls a line level audio input delivered to the speaker module.

28. The docking station of claim 7, wherein the portable media player comprises a portable media player control, and the portable media player control cannot be used when the remote control is used.

29. The docking station of claim 7, wherein the portable media player comprises portable media player control, and the remote control cannot be used when the portable media player controls are used.

30. The docking station of claim 1, further comprising a speaker module, wherein the speaker module receives audio information from a source other than the portable media player.

31. The docking station of claim 1, wherein the projection module receives video information from a source other than the portable media player.

32. The docking station of claim 1, further comprising a speaker module, wherein the speaker module and the projection module are operated independently of one another.

33. The docking station of claim 1, wherein the docking station is configured to receive a signal from a remote control and to translate the signal into an infrared signal that is transmitted to a stereo receiver.

34. The docking station of claim 1, wherein the docking station is configured to project video information that is received from the portable media player.

35. The docking station of claim 1, wherein the projection module projects information corresponding to audio content that is being played onto the viewing surface.

36. The docking station of claim 35, wherein the information corresponding to audio content that is being played includes at least one of a song name, an album name, a playing time, an album cover art, or a music video.

37. The docking station of claim 1, wherein the video image creates a desired atmosphere.

38. The docking station of claim 37, wherein the video image comprises one or more colors of light responsive to the music being played on the portable media player.

39. The docking station of claim 37, wherein the video image comprises shining points of light to simulate a disco scene.

40. The docking station of claim 1, wherein the projection module is configured to project at least one of a user interface and application software images onto the viewing surface.

41. The docking station of claim 1, wherein the docking station is configured to be controlled by voice activation.

42. The docking station of claim 1, wherein the docking connector can be configured so that the orientation of the portable media device relative the docking station can be selected from two or more different orientation positions.

43. The docking station of claim 1, wherein the projection module performs keystone correction.

44. The docking station of claim 1, further comprising an interface for sending video information from the portable media player to an external display device.

45. The docking station of claim 44, wherein the projection module and the external display device mirror the same video images.

46. The docking station of claim 44, wherein the projection module and the external display device simultaneously display different video images.

47. The docking station of claim 1, wherein the portable media player comprises a built-in display screen.

48. The docking station of claim 47, wherein the built-in display screen is used in conjunction with one or more of the projection module and an external display.

49. The docking station of claim 47, wherein the built-in display screen of the portable media player shows a user interface while the projection module is projecting video image data derived from the video information onto a viewing surface.

50. The docking station of claim 47, wherein the built-in display screen of the portable media player shows video image data while the projection module is projecting a user interface onto a viewing surface.

51. The docking station of claim 1, wherein the docking connector physically secures the portable media player by a snap-fit coupling.

52. The docking station of claim 1, wherein the docking connector physically secures the portable media player by a socket-fit coupling.

53. The docking station of claim 1, wherein the docking connector physically secures the portable media player by a magnetic coupling.

54. The docking station of claim 1, wherein the docking connector comprises an energy interface that allows energy to be transferred from the docking station to the portable media player.

55. The docking station of claim 1, wherein the docking station comprises an accessory interface that connects one or more accessory devices.

56. The docking station of claim 55, wherein the one or more accessory devices include at least one of a DVD player, a gaming console, or subwoofer speakers.

57. The docking station of claim 1, further comprising a wired network interface.

58. The docking station of claim 1, further comprising a wireless network interface.

59. The clocking station of claim 1, further comprising one or more wired or wireless input devices to control the docking station or the portable media player.

60. The docking station of claim 1 wherein the portable media player and the docking station transfer information wirelessly.

61. The docking connector of claim 1, wherein the docking connector is a standardized connector that is designed to receive a plurality of different compatible portable media players.

62. The docking connector of claim 1, wherein the docking connector is designed with a plurality of different adapters for receiving a plurality of differently configured portable media players.

63. The docking station of claim 1, wherein the docking connector includes the communication interface.

64. The docking station of claim 18, wherein the portable media player controls the projection module.

65. The docking station of claim 18, further comprising a speaker module, wherein the portable media player controls the speaker module.

66. The docking station of claim 18, wherein the portable media player controls the projection module and a speaker module.

67. The docking station of claim 64, further comprising a speaker module, wherein portable media player controls an amplified volume of the speaker module.

68. The docking station of claim 64, further comprising a speaker module, wherein portable media player controls a line level audio input delivered to the speaker module.

69. The docking station of claim 18, further comprising a speaker module, wherein the speaker module receives audio information from a source other than the portable media player.

70. The docking station of claim 18, wherein the projection module receives video information from a source other than the portable media player.

71. The docking station of claim 18, further comprising a speaker module, wherein the speaker module and the projection module are operated independently of one another.

72. The docking station of claim 18, wherein the projection module performs a keystone correction.

73. The docking station of claim 18, wherein the portable media player comprises a built-in display screen.

74. The docking station of claim 73, wherein the built-in display screen is used in conjunction with one or more of the projection module and an external display.

75. The docking station of claim 73, wherein the built-in display screen of the portable media player shows a user interface while the projection module is projecting video image data derived from the video information onto a viewing surface.

76. The docking station of claim 73, wherein the built-in display screen of the portable media player shows video image data while the projection module is projecting a user interface onto a viewing surface.

77. The docking station of claim 18, wherein the adapter physically secures the portable media player by a snap-fit coupling.

78. The docking station of claim 18, wherein the adapter physically secures the portable media player by a socket-fit coupling.

79. The docking station of claim 18, wherein the adapter physically secures the portable media player by a magnetic coupling.

80. The docking station of claim 18, wherein the docking connector comprises an energy interface that allows energy to be transferred from the docking station to the portable media player.

81. The docking station of claim 18, wherein the docking station comprises an accessory interface that connects one or more accessory devices.

82. The docking station of claim 81, wherein the one or more accessory devices include at least one of a DVD player, a gaming console, or subwoofer speakers.

[83. A docking station for a portable media player, the docking station comprising:

a docking connector to physically secure the portable media player;

a communication interface to communicatively couple the portable media player to the docking station when the docking connector is physically securing the portable media player; and a projection module operably linked to the communication interface and configured to receive video information from the portable media player via the communication interface, and to project a video image derived from the video information away from the docking station onto a viewing surface, wherein the portable media player includes a display screen and a control portion, and where the docking connector secures the portable media player with the display screen and the control portion of the portable media player facing away from the projected video image.]

84. The docking station of claim 128, where the projection module includes short throw projection optics.

85. The docking station of claim 128 further comprising: an adapter, wherein the adapter is one of a plurality of different adapters and each different adapter configured for different portable media player.

86. A docking station for a portable media player, the docking station comprising:

a docking connector to physically secure the portable media player:

a communication interface to communicatively couple the portable media player to the docking station when the docking connector is physically securing the portable media player; and a projection module operably linked to the communication interface and configured to receive video information from the portable media player via the communication interface, and to project a video image derived from the video information away from the docking station onto a viewing surface, a left and right speaker module for playing audio received from the portable media player, wherein the docking connector is disposed between the left and right speaker modules.

87. The docking station of claim 86, wherein the left and right speaker modules are disposed on a side opposite of a side from where light of the video image projected by the projection module exits.

88. The docking station of claim 86, where the projection module includes short throw projection optics.

89. The docking station of claim 86, where the portable media player includes a front face having a display screen, and where the docking connector secures the portable media player with the display screen of the portable media player facing away from the projected video image.

90. The docking station of claim 86, wherein the portable media player comprises a built-in display screen.

91. A docking station for a portable media player the docking station comprising:

a docking connector to physically secure the portable media player;

a communication interface to communicatively couple the portable media player to the docking station when the docking connector is physically securing the portable media player; and a projection module operably linked to the communication interface and configured to receive video information from the portable media player via the communication interface, and to project a video image derived from the video information away from the docking station onto a viewing surface, and having a projection lens which projects the video image, the projection lens disposed between a left speaker module and a right speaker module.

92. The docking station of claim 91, where the projection module includes short throw projection optics.

93. The docking station of claim 91, where the portable media player includes a front face having a display screen, and where the docking connector secures the portable media player with the display screen of the portable media player facing away from the projected video image.

94. The docking station of claim 91, wherein the portable media player comprises a built-in display screen.

95. A docking station for a portable media player, the docking station comprising:

a docking connector to physically secure the portable media player;

a communication interface to communicatively couple the portable media player to the docking station when the docking connector is physically securing the portable media player; and a projection module operably linked to the communication interface and configured to receive video information from the portable media player via the communication interface, and to project a video image derived from the video information away from the docking station onto a viewing surface, a control portion of the docking station, the control portion controls the docking station, the docking connector and the control portion are disposed on the upper side of the docking station.

96. The docking station of claim 95, where the projection module includes short throw projection optics.

97. The docking station of claim 95, where the portable media player includes a front face having a display screen, and where the docking connector secures the portable media player with the display screen of the portable media player facing away from the projected video image.

98. The docking station of claim 95, wherein the portable media player comprises a built-in display screen.

99. A docking station for a portable media player the docking station comprising:

a docking connector to physically secure the portable media player.

a communication interface to communicatively couple the portable media player to the docking station when the docking connector is physically securing the portable media player; and a projection module operably linked to the communication interface and configured to receive video information from the portable media player via the communication interface, and to project a video image derived from the video information away from the docking station onto a viewing surface, a control portion of the docking station, the control portion controls the docking station, the control portion is farther from the viewing surface than the docking connector.

100. The docking station of claim 99, where the projection module includes short throw projection optics.

101. The docking station of claim 99, wherein the portable media player comprises a built-in display screen.

102. The docking station of claim 99, where the portable media player includes a front face having a display screen, and where the docking connector secures the portable media player with the display screen of the portable media player facing away from the projected video image.

103. The docking station of claim 1, wherein the docking station is substantially larger than the portable media player.

104. A docking station for a portable media player, the docking station comprising:

a docking connector to physically secure the portable media player, a communication interface to communicatively couple the portable media player to the docking station when the docking connector is physically securing the portable media player: and a projection module operably linked to the communication interface and configured to receive video information from the portable media player via the communication interface, and to project a video image derived from the video information away from the docking station onto a viewing surface, an intake air port which intakes air from outside of the docking station, an exhaust air port which exhausts air to outside of the docking station, wherein the intake air port and the exhaust air port are disposed on the opposite side of the display screen of the portable media player.

105. The docking station of claim 104, where the projection module includes short throw projection optics.

106. The docking station of claim 105, where the portable media player includes a front face having a display screen, and where the docking connector secures the portable media player with the display screen of the portable media player facing away from the projected video image.

107. The docking station of claim 105, further comprising: an adapter, wherein the adapter is one of a plurality of different adapters and each different adapter configured for different portable media player.

108. A docking station for a portable media player, the docking station comprising:

a docking connector to physically secure the portable media player;

a communication interface to communicatively couple the portable media player to the docking station when the docking connector is physically securing the portable media player; and a projection module operably linked to the communication interface and configured to receive video information from the portable media player via the communication interface, and to project a video image derived from the video information away from the docking station onto a viewing surface, wherein the portable media player is a mobile phone, and wherein the docking station is substantially larger than the mobile phone.

109. The docking station of claim 108, where the projection module includes short throw projection optics.

110. The docking station of claim 108, where the portable media player includes a front face having a display screen, and where the docking connector secures the portable media player with the display screen of the portable media player facing away from the projected video image.

111. The docking station of claim 108, further comprising: an adapter, wherein the adapter is one of a plurality of different adapters and each different adapter configured for different portable media player.

112. A docking station for a portable media player, the docking station comprising:

a docking connector to physically secure the portable media player;

a communication interface to communicatively couple the portable media player to the docking station when the docking connector is physically securing the portable media player; and a projection module operably linked to the communication interface and configured to receive video information from the portable media player via the communication interface, and to project a video image derived from the video information away from the docking station onto a viewing surface, where the portable media player includes a front face having a display screen, and where the docking connector secures the portable media player with the display screen of the portable media player facing away from the projected video image, and where the projection module includes short throw projection optics.

113. The docking station of claim 112, wherein the docking station is substantially larger than the portable media player.

114. The docking station of claim 112, where a diagonal size of the projected image is greater than a distance from the projection module to the viewing surface.

115. The docking station of claim 112, further comprising: an adapter, wherein the adapter is one of a plurality of different adapters and each different adapter configured for different portable media player.

116. A docking station for a portable media player the docking station comprising:

a docking connector to physically secure the portable media player, a communication interface to communicatively couple the portable media player to the docking station when the docking connector is physically securing the portable media player:

a projection module operably linked to the communication interface and configured to receive video information from the portable media player via the communication interface, and to project a video image derived from the video information away from the docking station onto a viewing surface: and a remote command receiver to receive commands from a remote control and to deliver the commands to the portable media player via the communication interface, where the portable media player includes a front face having a display screen, and where the docking connector secures the portable media player with the display screen of the portable media player facing away from the projected video image.

117. The docking station of claim 116, wherein the docking station is substantially larger than the portable media player.

118. The docking station of claim 116, where a diagonal size of the projected image is greater than a distance from the projection module to the viewing surface.

119. The docking station of claim 1, further comprising: an adapter, wherein the adapter is one of a plurality of different adapters and each different adapter configured for different portable media player.

120. A docking station for a portable media player, the docking station comprising:

an adapter including a docking connector to physically secure the portable media player and a communication interface to communicatively couple the portable media player to the docking station when the docking connector is physically securing the portable media player, wherein the adapter is one of a plurality of different adapters, each different adapter configured to secure and communicatively couple a different portable media player: and a projection module operably linked to the communication interface and configured to receive video information from the portable media player via the communication interface, and to project a video image derived from the video information away from the docking station onto a viewing surface, where the portable media player includes a front face having a display screen, and where the docking connector secures the portable media player with the display screen of the portable media player facing away from the projected video image, and where the projection module includes short throw projection optics.

121. The docking station of claim 120, wherein the docking station is substantially larger than the portable media player.

122. The docking station of claim 120, where a diagonal size of the projected image is greater than a distance from the projection module to the viewing surface.

123. The docking station of claim 120, wherein the portable media player comprises a built-in display screen.

*124. The docking station of claim 1, wherein the docking connector comprises a direct interface.*

*125. The docking station of claim 83, where the projection module has a gain ratio in the range of 0.5:1 to 2:1.*

*126. A projector for a portable media player, the projector comprising:*

*a docking connector to connect the portable media player;*

*a communication interface to communicatively couple the portable media player to the docking station when the docking connector is connected to the portable media player;*

*a projection module linked to the communication interface and configured to receive video information from the portable media player via the communication interface, and to project a video image derived from the video information away from the docking station onto a viewing surface.*

*127. A projection system for a projector and a portable media player, and projection system comprising:*

*a docking connector to connect the portable media player;*

*a communication interface to communicatively couple the portable media player to the docking station when the docking connector is connected to the portable media player;*

*a projection module linked to the communication interface and configured to receive video information from the portable media player via the communication interface, and to project a video image derived from the video information away from the docking station onto a viewing surface.*

*128. A docking station for a portable media player, the docking station comprising:*

*a docking connector to physically secure the portable media player;*

*a communication interface to communicatively couple the portable media player to the docking station when the docking connector is physically securing the portable media player; and*

*a projection module operably linked to the communication interface and configured to receive video information from the portable media player via the communication interface, and to project a video image derived from the video information away from the docking station onto a viewing surface,*

*wherein the portable media player includes a display screen and a control portion, and where the docking connector secures the portable media player with the display screen and the control portion of the portable media player facing away from the projected video image.*

* * * * *